United States Patent
Uetani

(10) Patent No.: US 9,318,719 B2
(45) Date of Patent: Apr. 19, 2016

(54) METHOD OF PRODUCING ORGANIC PHOTOELECTRIC CONVERSION DEVICE

(71) Applicant: SUMITOMO CHEMICAL COMPANY, LTD., Chuo-ku, Tokyo (JP)

(72) Inventor: Yasunori Uetani, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 14/402,250

(22) PCT Filed: May 24, 2013

(86) PCT No.: PCT/JP2013/065121
§ 371 (c)(1),
(2) Date: Nov. 19, 2014

(87) PCT Pub. No.: WO2013/183548
PCT Pub. Date: Dec. 12, 2013

(65) Prior Publication Data
US 2015/0287943 A1    Oct. 8, 2015

(30) Foreign Application Priority Data

Jun. 7, 2012    (JP) .................... 2012-129532

(51) Int. Cl.
*H01L 51/44*    (2006.01)
*H01L 51/42*    (2006.01)
(Continued)

(52) U.S. Cl.
CPC .............. *H01L 51/4253* (2013.01); *B82Y 10/00* (2013.01); *H01L 51/4273* (2013.01);
(Continued)

(58) Field of Classification Search
CPC .................... H01L 21/02178; H01L 21/3164; H01L 21/0257; H01L 21/28079; H01L 21/02527; H01L 27/14643; H01L 28/65; H01L 29/1602; H01L 29/106; H01L 29/0852; H01L 51/008; H01L 51/0034; H01L 51/5287; H01L 51/5296; C07D 209/86; C07D 495/14
USPC ........... 438/82, 85, 91, 99, 106, 141, 104, 48, 438/70, 241, 608, 780; 257/E21.006, 257/E21.007, E21.081, E21.126, E21.127, 257/E21.264, E21.266, E21.267
See application file for complete search history.

(56) References Cited

U.S. PATENT DOCUMENTS 8,313,671 B2 * 11/2012 Kuwabara ............ C07D 495/14
252/299.61
8,629,431 B2 * 1/2014 Etori ................... H01L 51/0078
136/263

(Continued)

FOREIGN PATENT DOCUMENTS

JP        2012-004239 A    1/2012

OTHER PUBLICATIONS

Pablo P. Boix, et al., "Role of ZnO Electron-Selective Layers in Regular and Inverted Bulk Heterojunction Solar Cells," The Journal of Physical Chemistry Letters, vol. 2, 2011, pp. 407-411.
(Continued)

*Primary Examiner* — David Nhu
(74) *Attorney, Agent, or Firm* — Sughrue Mion, PLLC

(57) ABSTRACT

A method for producing an organic photoelectric conversion device, including a step of forming an anode, a step of forming an active layer on the above-described anode, a step of forming an oxide layer comprising a zinc oxide doped with at least one metal selected from the group consisting of gallium, aluminum, indium and boron on the above-described active layer, and a step of forming a cathode on the above-described oxide layer by a vacuum film formation method.

6 Claims, 1 Drawing Sheet

(51) Int. Cl.
 B82Y 10/00 (2011.01)
 H01L 51/00 (2006.01)
(52) U.S. Cl.
 CPC .............. H01L51/44 (2013.01); H01L 51/441 (2013.01); H01L 51/0036 (2013.01); H01L 51/0039 (2013.01); H01L 51/0043 (2013.01); H01L 51/0047 (2013.01); H01L 2251/303 (2013.01); Y02E 10/549 (2013.01); Y02P 70/521 (2015.11)

(56) References Cited

U.S. PATENT DOCUMENTS 8,664,518 B2 * 3/2014 Wachi ................... H01L 51/442
 136/252
8,895,850 B2 * 11/2014 Etori ....................... B82Y 20/00
 136/263
2014/0008747 A1 1/2014 Uetani

OTHER PUBLICATIONS

Kyung-Sik Shin, et al., "Enhanced Power Conversion Efficiency of Inverted Organic Solar Cells with a Ga-Doped ZnO Nanostructured Thin Film Prepared Using Aqueous Solution", J. Phys. Chem. C., vol. 114, 2010, pp. 15782-15785.

Jan Gilot, et al., "Double and triple junction polymer solar cells processed from solution", Applied Physics Letters, vol. 90, 2007, pp. 143512-1-143512-3.

Jan Gilot, et al., "The use of ZnO as optical spacer in polymer solar cells: Theoretical and experimental study", Applied Physics Letters, vol. 91, 2007, pp. 113520-1-113520-3.

* cited by examiner

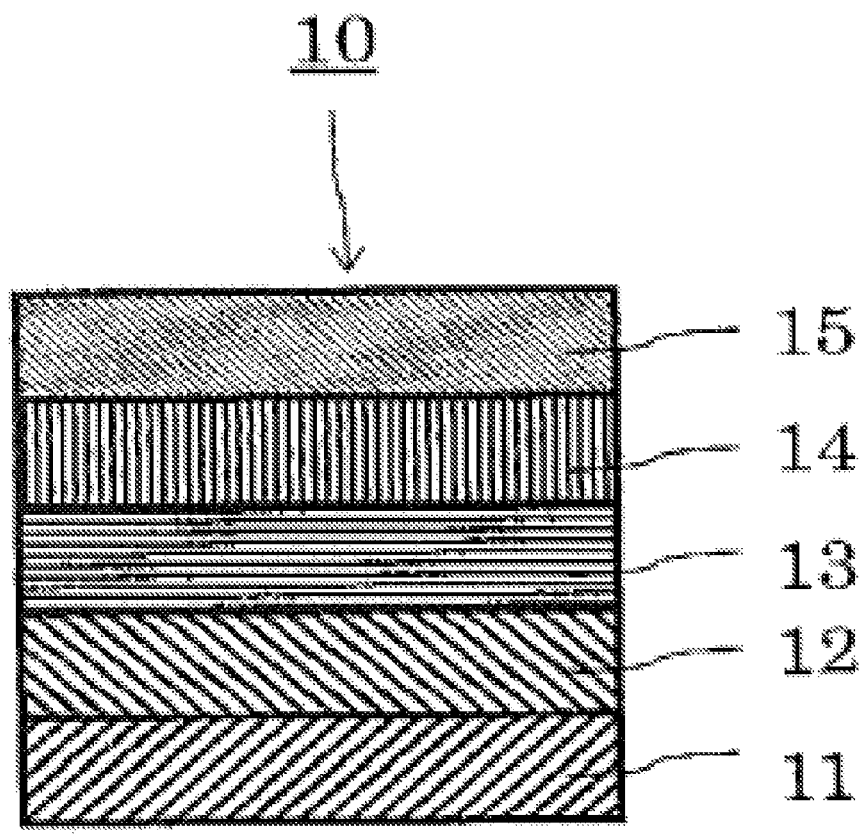

METHOD OF PRODUCING ORGANIC PHOTOELECTRIC CONVERSION DEVICE

CROSS REFERENCE TO RELATED APPLICATIONS

This application is a National Stage of International Application No. PCT/JP2013/065121 filed May 24, 2013, claiming priority based on Japanese Patent Application No. 2012-129532, filed Jun. 7, 2012, the contents of all of which are incorporated herein by reference in their entirety.

TECHNICAL FIELD

The present invention relates to a method of producing an organic photoelectric conversion device.

BACKGROUND ART

An organic photoelectric conversion device used in an organic solar battery, an optical sensor and the like is constituted of a pair of electrodes (anode and cathode) and an active layer disposed between the electrodes, and fabricated by laminating the electrodes, the active layer and the like in series in the given order.

In an organic photoelectric conversion device, an electron transporting layer and a hole transporting layer are provided in some cases in addition to the active layer. As such an electron transporting layer, a layer composed of zinc oxide is formed in a certain occasion (see, e.g., Non-patent document 1).

PRIOR ART DOCUMENT

Non-Patent Document

[Non-patent document 1] The Journal of Physical Chemistry Letters Vol. 2 (2011) pp. 407-411

SUMMARY OF THE INVENTION

Problem to be Solved by the Invention

In the method described in Non-patent document 1 of forming a layer composed of zinc oxide as the electron transporting layer, there is a problem that photoelectric conversion efficiency is not necessarily high. Therefore, the present invention has an object of providing a method of producing an organic photoelectric conversion device manifesting high photoelectric conversion efficiency.

Means for Solving the Problem

The present invention relates to a method for producing an organic photoelectric conversion device, comprising a step of forming an anode, a step of forming an active layer on the above-described anode, a step of forming an oxide layer comprising a zinc oxide doped with at least one metal selected from the group consisting of gallium, aluminum, indium and boron on the above-described active layer, and a step of forming a cathode on the above-described oxide layer by a vacuum film formation method.

The present invention relates to the method for producing an organic photoelectric conversion device, wherein the metal to be doped is gallium.

The present invention relates to the method for producing an organic photoelectric conversion device, wherein a coating solution comprising the zinc oxide doped with a metal described above is coated for film formation on the active layer to form the above-described oxide layer.

The present invention relates to the method for producing an organic photoelectric conversion device, wherein the zinc oxide doped with a metal described above is in the form of particles.

The present invention relates to the method for producing an organic photoelectric conversion device, wherein formation of the above-described active layer is conducted by a coating method.

The present invention relates to the method for producing an organic photoelectric conversion device, wherein the active layer comprises a fullerene and/or a fullerene derivative and a conjugated polymer compound.

BRIEF DESCRIPTION OF THE DRAWING

The FIGURE is a schematic illustration of a layer structure of a photoelectric conversion device according to an embodiment of the present invention.

MODES FOR CARRYING OUT THE INVENTION

The present invention will be illustrated in detail below.

<1> Constitution of Organic Photoelectric Conversion Device

The organic photoelectric conversion device of the present invention is an organic photoelectric conversion device having a constitution in which an anode, an active layer, an oxide layer and a cathode are laminated in this order on a supporting substrate.

Referring to the FIGURE, there is shown a photoelectric conversion device 10 according to an embodiment of the present invention including substrate 11, anode 12, active layer 13, oxide layer 14 and cathode 15.

At least one of an anode and a cathode is constituted of a transparent or semitransparent electrode. An incident light through the transparent or semitransparent electrode is absorbed in an electron accepting compound and/or an electron donating compound described later in the active layer, thereby generating an exciton formed by binding an electron and a hole. When this exciton moves in the active layer and reaches the heterojunction interface where an electron accepting compound and an electron donating compound are adjacent, an electron and a hole separate due to a difference in respective HOMO energy and LUMO energy at the interface, thereby generating independently movable charges (electron and hole). The generated charges move to respective electrodes and are taken out outside as electric energy (electric current).

(Supporting Substrate)

The organic photoelectric conversion device of the present invention is usually formed on a supporting substrate. As the supporting substrate, one which does not chemically change in fabricating an organic photoelectric conversion device is suitably used. The supporting substrate includes, for example, a glass substrate, a plastic substrate, a polymer film, a silicon plate and the like. In the case of an organic photoelectric conversion device of a mode of incorporating a light through a transparent or opaque anode, a substrate showing high light permeability is suitably used as the supporting substrate. In the case of fabrication of an organic photoelectric conversion device on an opaque substrate, the cathode is constituted of a transparent or semitransparent electrode since a light cannot be incorporated through the anode side. By using such an electrode, a light can be incorporated through a cathode situated at the opposite side to the anode disposed on the side of a supporting substrate even if the supporting substrate used is opaque.

(Active Layer)

The active layer can take a mode of a single layer or a mode of lamination of several layers. The active layer of a single layer mode is constituted of a layer containing an electron accepting compound and an electron donating compound.

The active layer of a mode of lamination of several layers is, for example, constituted of a laminate obtained by laminating a first active layer containing an electron donating compound and a second active layer containing an electron accepting compound. In this case, the first active layer is placed more closer to the anode than the second active layer.

The organic photoelectric conversion device may have a constitution of lamination of several active layers via an intermediate layer. In such a case, a multi-junction type device (tandem type device) is obtained. In this case, each active layer may be a single layer type containing an electron accepting compound and an electron donating compound, or a laminated type constituted of a laminate obtained by laminating a first active layer containing an electron donating compound and a second active layer containing an electron accepting compound.

The intermediate layer can take a mode of a single layer or a mode of lamination of several layers. The intermediate layer is constituted of what is called a charge injection layer or a charge transporting layer. As the intermediate layer, for example, a functional layer containing an electron transporting material described later can be used.

It is preferable that the active layer is formed by a coating method. It is preferable that the active layer contains a polymer compound, and the active layer may contain one polymer compound singly or contain two or more polymer compounds in combination. For enhancing the charge transportability of the active layer, an electron donating compound and/or an electron accepting compound may be mixed in the active layer.

The electron accepting compound used in an organic photoelectric conversion device is composed of a compound having its HOMO energy higher than the HOMO energy of an electron donating compound and having its LUMO energy higher than the LUMO energy of an electron donating compound.

The above-described electron donating compound may be a low molecular weight compound or a high molecular weight compound.

The low molecular weight electron donating compound includes phthalocyanine, metallophthalocyanine, porphyrin, metalloporphyrin, oligothiophene, tetracene, pentacene, rubrene and the like.

The high molecular weight electron donating compound includes polyvinylcarbazole and derivatives thereof, polysilane and derivatives thereof, polysiloxane derivatives having an aromatic amine in the side chain or main chain, polyaniline and derivatives thereof, polythiophene and derivatives thereof, polypyrrole and derivatives thereof, polyphenylenevinylene and derivatives thereof, polythienylenevinylene and derivatives thereof, polyfluorene and derivatives thereof, and the like.

The above-described electron accepting compound may be a low molecular weight compound or a high molecular weight compound.

The low molecular weight electron accepting compound includes oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof, fullerenes such as $C_{60}$ and the like and derivatives thereof, phenanthrene derivatives such as basocuproin and the like, etc.

The high molecular weight electron accepting compound includes polyvinylcarbazole and derivatives thereof, polysilane and derivatives thereof, polysiloxane derivatives having an aromatic amine in the side chain or main chain, polyaniline and derivatives thereof, polythiophene and derivatives thereof, polypyrrole and derivatives thereof, polyphenylenevinylene and derivatives thereof, polythienylenevinylene and derivatives thereof, polyfluorene and derivatives thereof, and the like. Of them, fullerenes and derivatives thereof are preferable.

The fullerenes include $C_{60}$, $C_{70}$ and carbon nanotubes. Specific structures of the $C_{60}$ fullerene derivative include those described below.

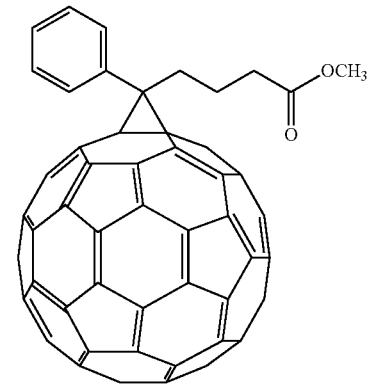

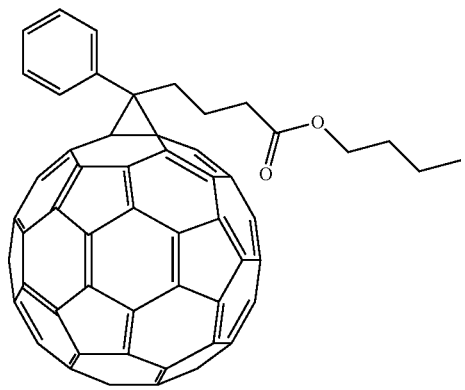

-continued

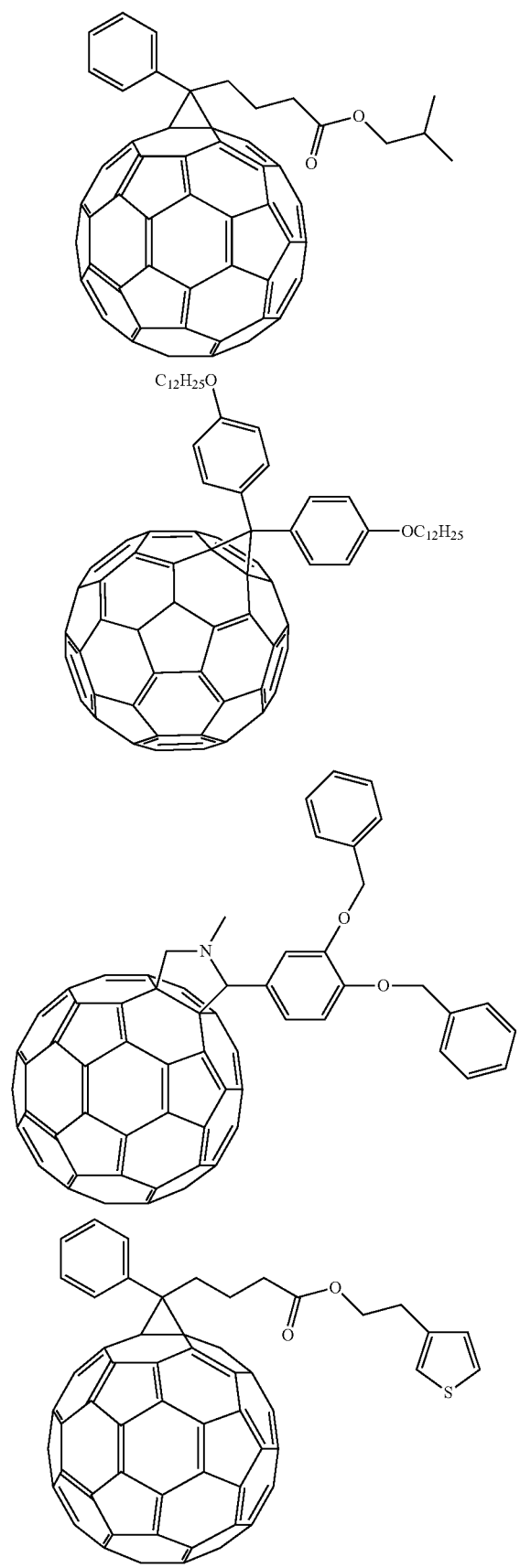

-continued

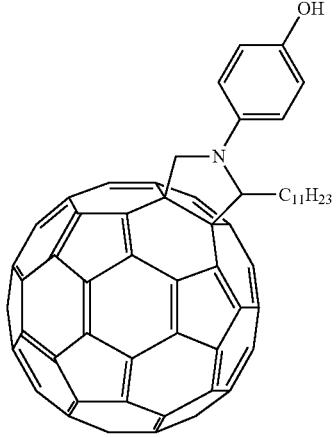

In a constitution in which the active layer contains an electron donating compound and an electron accepting compound composed of fullerenes and/or derivatives of fullerenes, the proportion of the fullerenes and derivatives of fullerenes is preferably 10 to 1000 parts by weight, more preferably 50 to 500 parts by weight with respect to 100 parts by weight of the electron donating compound. It is preferable that an organic photoelectric conversion device has the above-described single layer mode active layer, and it is more preferable, from the standpoint of inclusion of a lot of heterojunction interfaces, that an organic photoelectric conversion device has a single layer mode active layer containing an electron donating compound and an electron accepting compound composed of fullerenes and/or derivatives of fullerenes.

Particularly, is preferable that the active layer contains a conjugated polymer compound and fullerenes and/or derivatives of fullerenes. The conjugated polymer compound used in the active layer includes polythiophene and derivatives thereof, polyphenylenevinylene and derivatives thereof, polyfluorene and derivatives thereof and the like.

The thickness of the active layer is usually 1 nm to 100 μm, preferably 2 nm to 1000 nm, more preferably 5 nm to 500 nm, further preferably 20 nm to 200 nm.

(Oxide Layer)

The organic photoelectric conversion device of the present invention contains an oxide layer containing a zinc oxide doped with a metal. This oxide layer is disposed between an active layer and a cathode.

The zinc oxide doped with a metal contained in the above-described oxide layer is obtained by doping a zinc oxide with at least one metal selected from the group consisting of gallium, aluminum, indium and boron.

The metal to be doped in the above-described metal oxide is preferably gallium.

The doping concentration is usually 0.1 mole % to 50 mol %, preferably 0.5 mol % to 30 mol %, further preferably 1 mol % to 20 mol %.

It is preferable that the oxide layer is formed by a coating method, and for example, the oxide layer is preferably formed by coating a coating solution containing a zinc oxide doped with a metal described above and a solvent on the surface of a layer on which the oxide layer is to be provided. In the present invention, the coating solution includes also dispersions such as an emulsion, a suspension and the like. The zinc oxide doped with a metal described above contained in the coating solution is preferably gallium-doped zinc oxide.

In forming an oxide layer, it is preferable that a coating solution containing a zinc oxide doped with a metal described above in the form of particle is deposited to form the oxide layer. With respect to such an electron transporting material, it is more preferable to form an oxide layer using so-called nano particles of a zinc oxide doped with a metal. The zinc oxide doped with a metal described above in the form of particle is preferably gallium-doped zinc oxide. The sphere-equivalent average particle size of a zinc oxide doped with a metal in the form of particle and its preferable embodiment, particle-shaped gallium-doped zinc oxide is preferably 1 nm to 1000 nm, more preferably 10 nm to 100 nm. The average particle size is measured by a laser light scattering method and an X-ray diffraction method.

By providing an oxide layer containing a zinc oxide doped with a metal between a cathode and an active layer, peeling of the cathode can be prevented and electron injection efficiency from the active layer to the cathode can be enhanced. The oxide layer is preferably disposed in contact with an active layer, and further, it is preferable that the oxide layer is disposed also in contact with a cathode. By thus providing an oxide layer containing a zinc oxide doped with a metal, peeling of the cathode can be prevented and electron injection efficiency from the active layer to the cathode can be further enhanced. By providing such an oxide layer, an organic photoelectric conversion device having high reliability and showing high photoelectric conversion efficiently can be realized.

The oxide layer containing a zinc oxide doped with a metal functions as so-called an electron transporting layer and/or an electron injection layer. By providing such an oxide layer, efficiency of electron injection into a cathode can be enhanced, injection of holes from an active layer can be prevented, electron transportability can be enhanced, and deterioration of an active layer can be suppressed.

(Electrode)

The organic photoelectric conversion device of the present invention has a pair of electrodes. One of the pair of electrodes is an anode and another electrode is a cathode. It is preferable that at least one electrode of the pair of electrodes is transparent or semitransparent. The material of the transparent or semitransparent electrode includes a metal oxide film, a semitransparent metal film and the like having electric conductivity. Specific examples thereof include indium oxide, zinc oxide, tin oxide, indium tin oxide (Indium Tin Oxide: abbreviation ITO), indium zinc oxide (Indium Zinc Oxide: abbreviation IZO), gold, platinum, silver and copper, and preferable are ITO, IZO and tin oxide. Further, a transparent conductive film made of an organic material such as polyaniline and derivatives thereof, polythiophene and derivatives thereof and the like may also be used as the electrode.

One of a pair of electrodes which the organic photoelectric conversion device of the present invention has may be opaque. As the opaque electrode, for example, a metal film having such thickness that a light does not permeate can be used. The material of the opaque electrode includes, for example, metal such as lithium, sodium, potassium, rubidium, cesium, magnesium, calcium, strontium, barium, aluminum, scandium, vanadium, zinc, yttrium, indium, cerium, samarium, europium, terbium, ytterbium, gold, silver, platinum, copper, manganese, titanium, cobalt, nickel, tungsten, tin and the like, alloys composed of two or more of them, graphite or graphite intercalation compounds.

In this embodiment, a cathode is formed by a vacuum film formation method. The vacuum film formation method includes a vacuum vapor deposition method, a sputtering method, an ion plating method and the like.

The constitution of an organic photoelectric conversion device is not limited to the above-described device constitution, and additional layers may be further provided between an anode and a cathode. The additional layers include, for example, a hole transporting layer transporting holes, an electron transporting layer transporting electrons, a buffer layer and the like. For example, a hole transporting layer is provided between an anode and an active layer, an electron transporting layer is provided between an active layer and an oxide layer, and a buffer layer is provided, for example, between a cathode and an oxide layer, and the like. By providing a buffer layer, flattening of the surface and charge injection can be promoted.

As the materials used in a hole transporting layer or an electron transporting layer as the above-described additional layer, an electron donating compound and an electron accepting compound described above can be used respectively. As the material used in a buffer layer as the additional layer, halides, oxides and the like of alkali metals and alkaline earth metals such as lithium fluoride and the like can be used. It is also possible to form a charge transporting layer using fine particles of an inorganic semiconductor such as titanium oxide and the like. For example, an electron transporting layer can be formed by coating a titania solution to form a film on a ground layer on which the electron transporting layer is to be formed and further drying this.

<2> Method of Producing Organic Photoelectric Conversion Device

The method of producing an organic photoelectric conversion device of the present invention comprises a step of forming an anode, a step of forming an active layer on the above-described anode, a step of forming an oxide layer containing a zinc oxide doped with at least one metal selected from the group consisting of gallium, aluminum, indium and boron on the above-described active layer, and a step of forming a cathode on the above-described oxide layer by a vacuum film formation method. It is preferable that these steps are conducted in the described order. The embodiment of forming a prescribed layer on a prescribed layer includes an embodiment in which these layers are in contact with each other and also an embodiment in which other prescribed layer intervenes between these layers.

<Anode Forming Step>

An anode is formed by depositing the anode material exemplified above on the above-described supporting substrate by a vacuum vapor deposition method, a sputtering method, an ion plating method, a plating method and the like. An anode may also be formed by a coating method using a coating solution containing an organic material such as polyaniline and derivatives thereof, polythiophene and derivatives thereof and the like, a metal ink, a metal past, a low melting point metal under melted condition and the like.

<Active Layer Forming Step>

Though the method of forming an active layer is not particularly restricted, it is preferable to form an active layer by a coating method from the standpoint of simplification of the production process. An active layer can be formed by a coating method using a coating solution containing, for example, a solvent and the active layer constituent material described above, and for example, can be formed by a coating method using a coating solution containing a conjugated polymer compound and fullerenes and/or derivatives of fullerenes and a solvent.

The solvent includes, for example, hydrocarbon solvents such as toluene, xylene, mesitylene, tetralin, decalin, bicyclohexyl, n-butylbenzene, s-butylbenzene, t-butylbenzene and the like, halogenated saturated hydrocarbon solvents such as carbon tetrachloride, chloroform, dichloromethane, dichloroethane, chlorobutane, bromobutane, chloropentane, bromopentane, chlorohexane, bromohexane, chlorocyclohexane, bromocyclohexane and the like, halogenated unsaturated hydrocarbon solvents such as chlorobenzene, dichlorbenzene, trichlorobenzene and the like, ether solvents such as tetrahydrofuran, tetrahydropyran and the like, etc. The coating solution used in the present invention may contain two or more solvents, and may contain two or more solvents exemplified above.

The method of coating a coating solution containing the above-described active layer constituent material includes coating methods such as a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a dispenser printing method, a nozzle coat method, a capillary coat method and the like. Of them, a spin coat method, a flexo printing method, an inkjet printing method and a dispenser printing method are preferable.

<Oxide Layer Forming Step>

In this step, an oxide layer is formed on an active layer. That is, an oxide layer containing a zinc oxide doped with a metal described above is formed after formation of the above-described active layer and before formation of the above-described cathode. It is preferable that an oxide layer is formed by a coating method, and for example, an oxide layer is preferably formed by coating a coating solution containing a solvent and a zinc oxide doped with a metal described above on the surface of a layer on which the oxide layer is to be provided. The zinc oxide doped with a metal described above contained in a coating solution is preferably gallium-doped zinc oxide.

When an oxide layer is disposed in contact with an active layer, the oxide layer is formed by coating the above-described coating solution on the surface of the active layer. In forming an oxide layer, it is preferable to use a coating solution giving little damage on a layer (active layer or the like) on which the coating solution is coated, and specifically, it is preferable to use a coating solution scarcely dissolving a layer (active layer or the like) on which the coating solution is coated. For example, when a coating solution used in forming a cathode is coated on an active layer, it is preferable to form an oxide layer using a coating solution giving smaller damage on an active layer than the damage inflicted on an active layer by the above-described coating solution, and specifically, it is preferable to form an oxide layer using a coating solution manifesting smaller solubility for an active layer than that of a coating solution used in forming a cathode.

The coating solution used in coating and forming an oxide layer contains a solvent and a zinc oxide doped with a metal described above.

The solvent of the above-described coating solution includes water, alcohols, ketones and the like, and specific examples of the alcohol include methanol, ethanol, isopropanol, butanol, ethylene glycol, propylene glycol, butoxyethanol, methoxybutanol and the like and specific examples of the ketone include acetone, methyl ethyl ketone, methyl isobutyl ketone, 2-heptanone, cyclohexanone, and a mixture of two or more of them, and the like. The coating solution used in the present invention may contain two or more solvents, and may contain two or more solvents exemplified above.

<Cathode Forming Step>

It is preferable that a cathode is formed by a vacuum film formation method on the surface of an active layer or an oxide layer and the like.

According to the present invention, an organic photoelectric conversion device manifesting high photoelectric conversion efficiency can be produced.

The organic photoelectric conversion device of the present invention is irradiated with a light such as sunlight or the like through a transparent or semitransparent electrode, thereby generating photovoltaic power between electrodes, thus, it can be operated as an organic film solar battery.

A plurality of organic film solar batteries can also be integrated and used as an organic film solar battery module.

By irradiating with a light through a transparent or semitransparent electrode under condition of application of voltage between electrodes, photocurrent flows, thus, the organic photoelectric conversion device of the present invention can be operated as an organic optical sensor. A plurality of organic optical sensors can also be integrated and used as an organic image sensor.

EXAMPLES

Examples for illustrating the present invention further in detail will be shown below, but the present invention is not limited to them.

In the following examples, the polystyrene-equivalent number-average molecular weight was measured using GPC manufactured by GPC Laboratory Co., Ltd. (PL-GPC2000), as the molecular weight of a polymer. A polymer was dissolved in o-dichlorobenzene so that the concentration of the polymer was about 1% by weight. As the mobile phase of GPC, o-dichlorobenzene was used, and allowed to flow at a flow rate of 1 mL/min at a measurement temperature of 140° C. Three columns of PLGEL 10 μm MIXED-B (manufactured by PL Laboratory Co., Ltd.) were serially connected.

Synthesis Example 1

Synthesis of Polymer 1

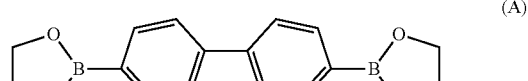

(A)

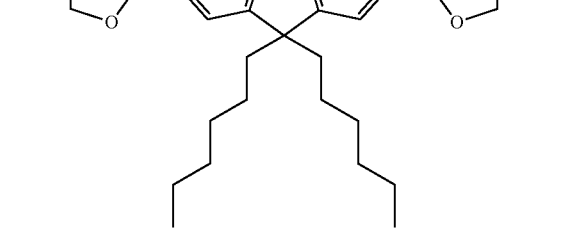

(B)

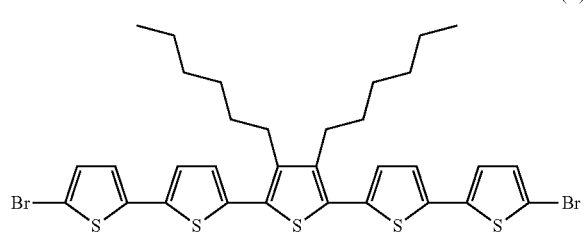

Into a 2 L four-necked flask an interior gas of which had been purged with argon were charged the above-described compound A (7.928 g, 16.72 mmol), the above-described compound B (13.00 g, 17.60 mmol), methyltrioctylammonium chloride (trade name: aliquat336, manufactured by Aldrich, $CH_3N[(CH_2)_7CH_3]_3Cl$, density 0.884 g/ml, 25° C., trademark of Henkel Corporation) (4.979 g) and 405 ml of toluene, and the content in the system was bubbled with argon for 30 minutes while stirring. Dichlorobis(triphenylphosphine)palladium(II) (0.02 g) was added, the mixture was heated up to 105° C., and 42.2 ml of a 2 mol/L sodium carbonate aqueous solution was dropped while stirring. After completion of dropping, the mixture was reacted for 5 hours, phenylboronic acid (2.6 g) and 1.8 ml of toluene were added and the mixture was stirred at 105° C. for 16 hours. Toluene (700 ml) and a 7.5% sodium diethyldithiocarbamate tri-hydrate aqueous solution (200 ml) were added and the mixture was stirred at 85° C. for 3 hours. After removal of the aqueous layer, the mixture was washed with 300 ml of 60° C. ion exchanged water twice, 300 ml of 60° C. 3% acetic acid once, further, 300 ml of 60° C. ion exchanged water three times. The organic layer was allowed to pass through a column filled with Celite, alumina and silica, and the column was washed with 800 ml of hot toluene. The solution was condensed to 700 ml, then, poured into 2 L of methanol, to cause re-precipitation. The polymer was filtrated and recovered, and washed with 500 ml of methanol, acetone and methanol. The polymer was dried in vacuo at 50° C. overnight, to obtain 12.21 g of a pentathienyl-fluorene copolymer (hereinafter, referred to as "polymer 1") having a repeating unit represented by the following formula:

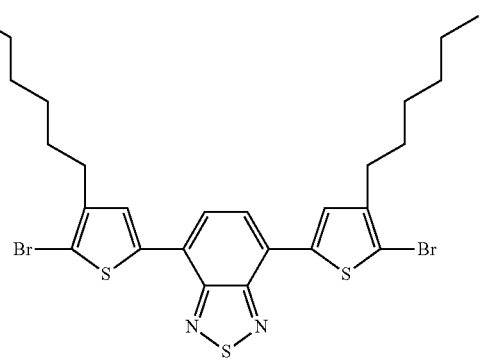
(D)

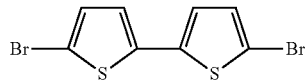
(E)

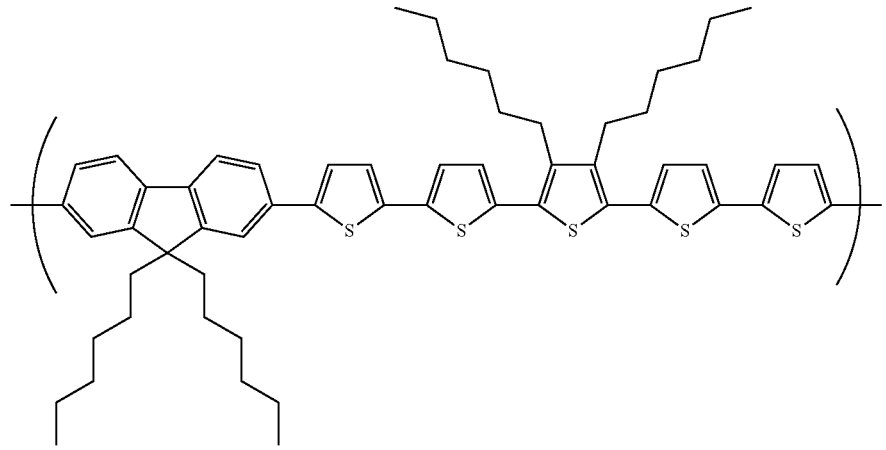

The polymer 1 had a polystyrene-equivalent number-average molecular weight of $5.4 \times 10^4$, and a polystyrene-equivalent weight-average molecular weight of $1.1 \times 10^5$.

Synthesis Example 2

Synthesis of Polymer 2

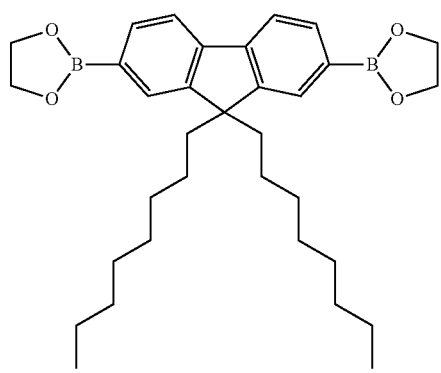
(C)

Into a 200 ml separable flask were charged 0.65 g of methyltrioctylammonium chloride (trade name: aliquat336 (registered trademark), manufactured by Aldrich, $CH_3N[(CH_2)_7CH_3]_3Cl$, density 0.884 g/ml, 25° C.), 1.5779 g of a compound (C) and 1.1454 g of a compound (E), and a gas in the flask was purged with nitrogen. Into the flask, 35 ml of toluene having undergone argon bubbling was added, dissolved with stirring, then, the mixture was further bubbled with argon for 40 minutes. The temperature of a bath for heating the flask was raised up to 85° C., then, to the reaction solution were added 1.6 mg of palladium acetate and 6.7 mg of tris o-methoxyphenylphosphine, and subsequently, 9.5 ml of a 17.5 wt % sodium carbonate aqueous solution was dropped over a period of 6 minutes while raising the temperature of the bath up to 105° C. After dropping, the mixture was stirred for 1.7 hours while keeping the temperature of the bath at 105° C., and thereafter, the reaction solution was cooled down to room temperature.

Next, to the reaction solution were added 1.0877 g of the compound (C) and 0.9399 g of the compound (D), and further, 15 ml of toluene having undergone argon bubbling was added, the mixture was dissolved with stirring, then, the mixture was further bubbled with argon for 30 minutes. To the reaction solution were added 1.3 mg of palladium acetate and 4.7 mg of tris o-methoxyphenylphosphine, subsequently, 6.8 ml of a 17.5 wt % sodium carbonate aqueous solution was dropped over a period of 5 minutes while raising the temperature of the bath up to 105° C. After dropping, the mixture was stirred for 3 hours while keeping the temperature of the bath at 105° C. After stirring, to the reaction solution were added 50 ml of toluene having undergone argon bubbling, 2.3 mg of palladium acetate, 8.8 mg of tris o-methoxyphenylphosphine and 0.305 g of phenylboronic acid, and the mixture was stirred for 8 hours while keeping the temperature of the bath at 105° C. Next, the aqueous layer of the reaction solution was removed, then, an aqueous solution prepared by dissolving 3.1 g of sodium N,N-diethyldithiocarbamate in 30 ml of water was added, and the mixture was stirred for 2 hours while keeping the temperature of the bath at 85° C. Subsequently, to the reaction solution was added 250 ml of toluene to cause separation of the reaction solution, and the organic layer was washed with 65 ml of water twice, 65 ml of 3 wt % acetic acid water twice and 65 ml of water twice. To the organic layer after washing was added 150 ml of toluene for dilution, and the mixture was dropped into 2500 ml of methanol to cause re-precipitation of a polymer compound. The polymer compound was filtrated, and dried under reduced pressure, then, dissolved in 500 ml of toluene. The resultant toluene solution was allowed to pass through a silica gel-alumina column, and the resultant toluene solution was dropped into 3000 ml of methanol, to cause re-precipitation of a polymer compound. The polymer compound was filtrated, and dried under reduced pressure, then, 3.00 g of a polymer 2 was obtained.

The resultant polymer 2 had a polystyrene-equivalent weight-average molecular weight of 257000 and a polystyrene-equivalent number-average molecular weight of 87000.

The polymer 2 is a block copolymer represented by the following formula.

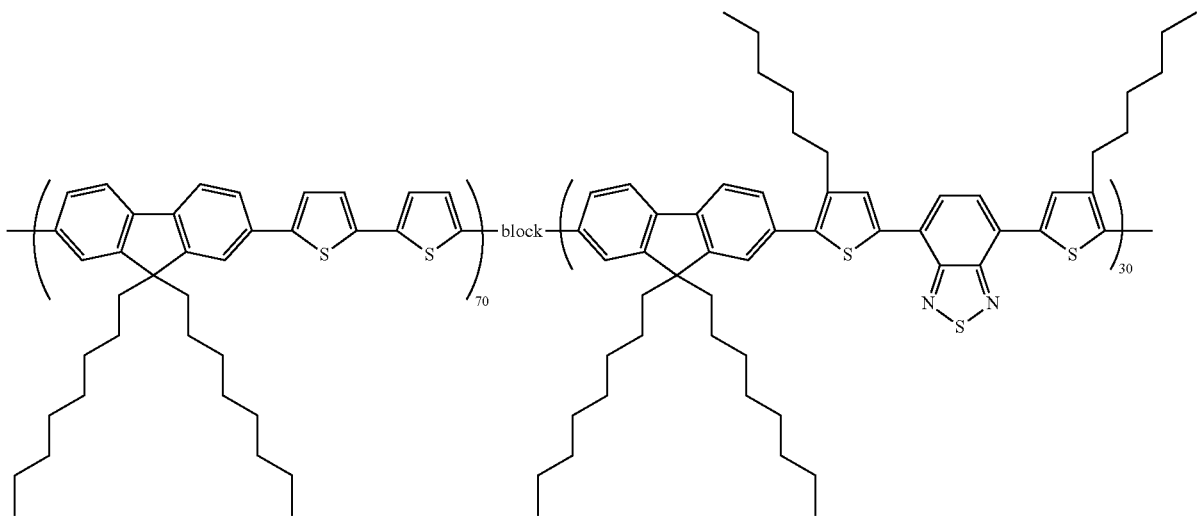

Synthesis Example 3

Synthesis of Compound 2

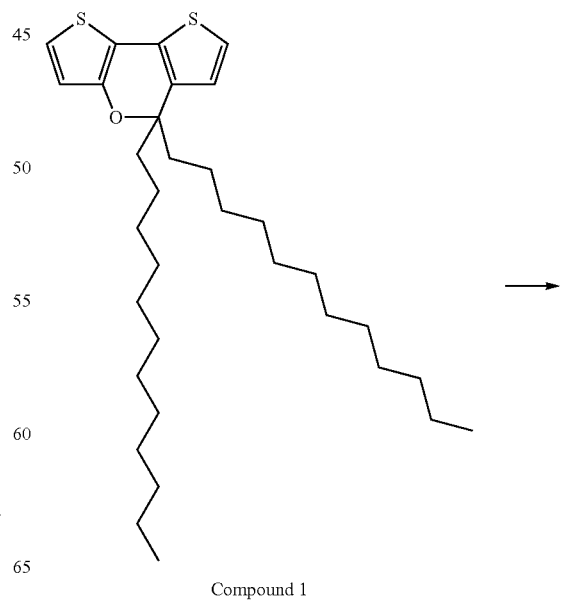

Compound 1

compound 2

Into a 200 mL flask an interior gas of which had been purged with argon were charged 2.00 g (3.77 mmol) of a compound 1 synthesized according to a description of WO 2011/052709 and 100 mL of dehydrated tetrahydrofuran and a uniform solution was prepared. The solution was kept at −78° C., and 5.89 mL (9.42 mmol) of a 1.6M n-butyllithium hexane solution was dropped into the solution over a period of 10 minutes. After dropping, the reaction solution was stirred at −78° C. for 30 minutes, then, stirred at room temperature (25° C.) for 2 hours. Thereafter, the flask was cooled down to −78° C., and 3.37 g (10.4 mmol) of tributyltin chloride was added to the reaction solution. After addition, the reaction solution was stirred at −78° C. for 30 minutes, then, stirred at room temperature (25° C.) for 3 hours. Thereafter, to the reaction solution was added 200 ml of water to stop the reaction, and ethyl acetate was added and the organic layer containing the reaction product was extracted. The organic layer was dried over sodium sulfate, filtrated, then, the filtrate was concentrated by an evaporator, and the solvent was distilled off. The resultant oily substance was purified by a silica gel column using hexane as a developing solvent. As the silica gel in the silica gel column, silica gel prepared by previously immersing into hexane containing 10 wt % triethylamine for 5 minutes, then, rinsing with hexane was used. After purification, 3.55 g (3.20 mmol) of a compound 2 was obtained.

Synthesis Example 4

Synthesis of Polymer 3

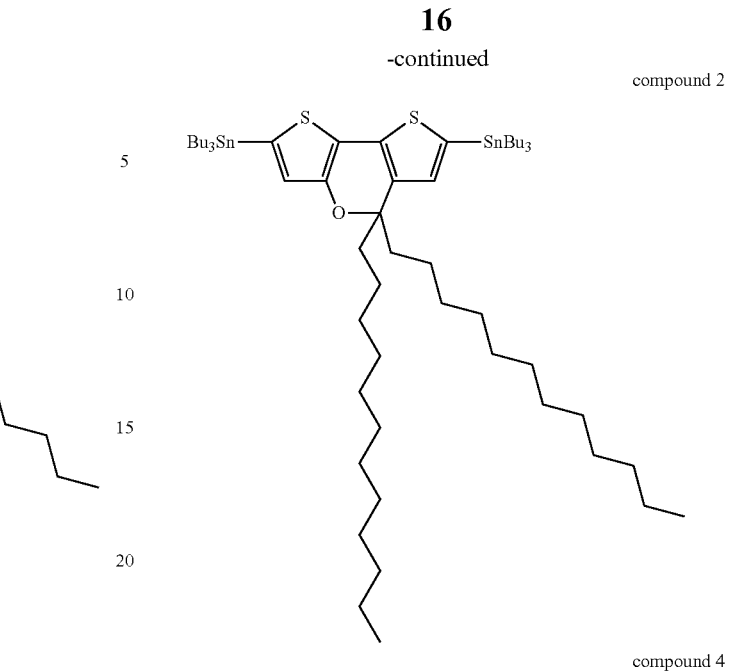

compound 2

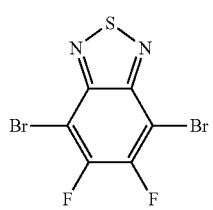

compound 4

Into a 300 mL flask an interior gas of which had been purged with argon were charged 800 mg (0.760 mmol) of a compound 3 synthesized according to a description of WO 2011/052709, 840 mg (0.757 mmol) of the compound 2, 471 mg (1.43 mmol) of a compound 4 synthesized according to a description of WO 2011/052709 and 107 ml of toluene and a uniform solution was prepared. The resultant toluene solution was bubbled with argon for 30 minutes. Thereafter, to the toluene solution were added 19.6 mg (0.0214 mmol) of tris (dibenzylideneacetone)dipalladium and 39.1 mg (0.128 mmol) of tris(2-toluyl)phosphine, and the mixture was stirred at 100° C. for 6 hours. Thereafter, to the reaction solution was added 660 mg of phenyl bromide, and the mixture was further stirred for 5 hours. Thereafter, the flask was cooled down to 25° C., and the reaction solution was poured into 2000 mL of methanol. The deposited polymer was filtrated and collected, the resultant polymer was placed in a cylindrical paper filter, and extracted with methanol, acetone and hexane, each for 5 hours, using a Soxhlet extractor. The polymer remaining in the cylindrical paper filter was dissolved in 53 mL of o-dichlorobenzene, and 1.21 g of sodium diethyldithiocarbamate and 12 mL of water were added, and the mixture was stirred for 8 hours under reflux. After removal of the aqueous layer, the organic layer was washed with 200 ml of water twice, then, with 200 mL of a 3 wt % acetic acid aqueous solution twice, then, with 200 mL of water twice, and the resultant solution was poured into methanol, to cause deposition of a polymer. The polymer was filtrated, then, dried, and the resultant polymer was dissolved again in 62 mL of o-dichlorobenzene, and allowed to pass through an alumina/silica gel column. The resultant solution was poured into methanol to cause deposition of a polymer, and the polymer was filtrated, then, dried, to obtain 802 mg of a purified polymer. Hereinafter, this polymer is called a polymer 3.

(Production of Composition 1)

Twenty five (25) parts by weight of [6,6]-phenylC71-butyric acid methyl ester (C70PCBM) (ADS71BFA manufactured by American Dye Source, Inc.) as derivatives of fullerenes, 2.5 parts by weight of the polymer 1 as an electron donating compound, 2.5 parts by weight of the polymer 2 and 1000 parts by weight of o-dichlorobenzene as a solvent were mixed. Next, the mixed solution was filtrated through Teflon (registered trademark) filter having a pore size of 1.0 μm, to prepare a composition 1.

(Production of Composition 2)

Ten (10) parts by weight of [6,6]-phenylC71-butyric acid methyl ester (C70PCBM) (ADS71BFA manufactured by American Dye Source, Inc.) as derivatives of fullerenes, 5 parts by weight of the polymer 3 as an electron donating compound and 1000 parts by weight of o-dichlorobenzene as a solvent were mixed. Next, the mixed solution was filtrated through Teflon (registered trademark) filter having a pore size of 1.0 μm, to prepare a composition 2.

Example 1

Fabrication and Evaluation of Organic Film Solar Battery

A glass substrate carrying an ITO film functioning as an anode of a solar battery formed thereon was prepared. The ITO film had been formed by a sputtering method, and its thickness was 150 nm. This glass substrate was subjected to an ozone UV treatment, performing a surface treatment of the ITO film. Next, a PEDOT:PSS solution (manufactured by Heraeus Materials Technology, CleviosP VP AI4083) was coated on the ITO film by spin coating, and heated in atmospheric air at 120° C. for 10 minutes, to form a hole injection layer having a thickness of 30 nm. On this hole injection layer, the above-described composition 1 was coated by spin coating, to form an active layer (thickness: about 200 nm).

Next, 1 part by weight of a 20 wt % methyl ethyl ketone dispersion of gallium-doped zinc oxide nano particles (particle size: 20 nm to 40 nm) (Pazet GK, manufactured by Hakusui Tech) and 10 parts by weight of methyl ethyl ketone were mixed, to prepare a coating solution. This coating solution was coated with a thickness of 19 nm on the active layer by spin coating, and dried to form an oxide layer. Thereafter, silver was vapor-deposited with a thickness of 100 nm by a vacuum vapor deposition machine, to fabricate an organic film solar battery. The degree of vacuum in vapor deposition was constantly 1 to $9 \times 10^{-3}$ Pa. Thereafter, the organic film solar battery device was sealed with a glass plate using a UV curing sealant. The shape of the resultant organic film solar battery was 2 mm×2 mm regular tetragon. The resultant organic film solar battery was irradiated with a constant light using Solar Simulator (manufactured by Bunkoukeiki Co., Ltd., trade name: OTENTO-SUNII: AM 1.5G filter, irradiance: 100 mW/cm$^2$), and the generating current and voltage were measured and the photoelectric conversion efficiency was determined. The photoelectric conversion efficiency was 6.32%, the short circuit current density was 10.65 mA/cm$^2$, the open circuit voltage was 0.91 V, and FF (fill factor) was 0.65.

Example 2

Fabrication and Evaluation of Organic Film Solar Battery

A glass substrate carrying an ITO film functioning as an anode of a solar battery formed thereon was prepared. The ITO film had been formed by a sputtering method, and its thickness was 150 nm. This glass substrate was subjected to an ozone UV treatment, performing a surface treatment of the ITO film. Next, a PEDOT:PSS solution (manufactured by Heraeus Materials Technology, CleviosP VP AI4083) was coated on the ITO film by spin coating, and heated in atmospheric air at 150° C. for 10 minutes, to form a hole injection layer having a thickness of 30 nm. On this hole injection layer, the above-described composition 2 was coated by spin coating, to form an active layer (thickness: about 100 nm).

Next, 1 part by weight of a 20 wt % methyl ethyl ketone dispersion of gallium-doped zinc oxide nano particles (particle size: 20 nm to 40 nm) (Pazet GK, manufactured by Hakusui Tech) and 10 parts by weight of methyl ethyl ketone were mixed, to prepare a coating solution. This coating solution was coated with a thickness of 19 nm on the active layer by spin coating, and dried to form an oxide layer. Thereafter, the layer was baked under a nitrogen atmosphere under condition of 150° C./10 minutes. Thereafter, silver was vapor-deposited with a thickness of 100 nm by a vacuum vapor deposition machine, to fabricate an organic film solar battery. The degree of vacuum in vapor deposition was constantly 1 to $9 \times 10^{-3}$ Pa. Thereafter, the organic film solar battery device was sealed with a glass plate using a UV curing sealant. The shape of the resultant organic film solar battery was 2 mm×2 mm regular tetragon. The resultant organic film solar battery was irradiated with a constant light using Solar Simulator (manufactured by Bunkoukeiki Co., Ltd., trade name: OTENTO-SUNII: AM 1.5G filter, irradiance: 100 mW/cm$^2$), and the generating current and voltage were measured and the photoelectric conversion efficiency was determined. The photoelectric conversion efficiency was 5.57%, the short circuit current density was 13.63 mA/cm$^2$, the open circuit voltage was 0.71 V, and FF (fill factor) was 0.57.

Thereafter, the device was preserved with heating for 50 hours in a constant temperature chamber at 85° C. in atmospheric air. Thereafter, the device was returned to room temperature, and the photoelectric conversion efficiency was determined. The photoelectric conversion efficiency was 5.92%, the short circuit current density was 14.26 mA/cm$^2$, the open circuit voltage was 0.72 V, and FF (fill factor) was 0.57.

Example 3

Fabrication and Evaluation of Organic Film Solar Battery

A glass substrate carrying an ITO film functioning as an anode of a solar battery formed thereon was prepared. The ITO film had been formed by a sputtering method, and its thickness was 150 nm. This glass substrate was subjected to an ozone UV treatment, performing a surface treatment of the ITO film. Next, a PEDOT:PSS solution (manufactured by Heraeus Materials Technology, CleviosP VP AI4083) was coated on the ITO film by spin coating, and heated in atmospheric air at 150° C. for 10 minutes, to form a hole injection layer having a thickness of 30 nm. On this hole injection layer, the above-described composition 2 was coated by spin coating, to form an active layer (thickness: about 100 nm).

Next, 1 part by weight of a 20 wt % isopropanol dispersion of gallium-doped zinc oxide nano particles (particle size: 20 nm to 40 nm) (Pazet GK, manufactured by Hakusui Tech) and 20 parts by weight of isopropanol were mixed, to prepare a coating solution. This coating solution was coated with a thickness of 16 nm on the active layer by spin coating, and dried to form an oxide layer. Thereafter, silver was vapor-deposited with a thickness of 100 nm by a vacuum vapor deposition machine, to fabricate an organic film solar battery. The degree of vacuum in vapor deposition was constantly 1 to 9×10⁻³ Pa. Thereafter, the organic film solar battery device was sealed with a glass plate using a UV curing sealant. The shape of the resultant organic film solar battery was 2 mm×2 mm regular tetragon. The resultant organic film solar battery was irradiated with a constant light using Solar Simulator (manufactured by Bunkoukeiki Co., Ltd., trade name: OTENTO-SUNII: AM 1.5G filter, irradiance: 100 mW/cm²), and the generating current and voltage were measured and the photoelectric conversion efficiency was determined. The photoelectric conversion efficiency was 7.81%, the short circuit current density was 17.47 mA/cm², the open circuit voltage was 0.71 V, and FF (fill factor) was 0.63.

Thereafter, the device was preserved with heating for 1000 hours in a constant temperature chamber at 85° C. in atmospheric air. Thereafter, the device was returned to room temperature, and the photoelectric conversion efficiency was determined. The photoelectric conversion efficiency was 6.55%, the short circuit current density was 16.44 mA/cm², the open circuit voltage was 0.72 V, and FF (fill factor) was 0.55.

Comparative Example 1

Fabrication and Evaluation of Organic Film Solar Battery

A glass substrate carrying an ITO film functioning as an anode of a solar battery formed thereon was prepared. The ITO film had been formed by a sputtering method, and its thickness was 150 nm. This glass substrate was subjected to an ozone UV treatment, performing a surface treatment of the ITO film. Next, a PEDOT:PSS solution (manufactured by Heraeus Materials Technology, CleviosP VP AI4083) was coated on the ITO film by spin coating, and heated in atmospheric air at 150° C. for 10 minutes, to form a hole injection layer having a thickness of 30 nm. On this hole injection layer, the above-described composition 1 was coated by spin coating, to form an active layer (thickness: about 100 nm).

Next, 1 part by weight of a 45 wt % isopropanol dispersion of zinc oxide nano particles (particle size: 20 nm to 30 nm) (HTD-711Z, manufactured by TAYCA Corporation) and 10 parts by weight of isopropanol were mixed, to prepare a coating solution. This coating solution was coated with a thickness of 50 nm on the active layer by spin coating, and dried to form an oxide layer. Thereafter, silver was vapor-deposited with a thickness of 100 nm by a vacuum vapor deposition machine, to fabricate an organic film solar battery. The degree of vacuum in vapor deposition was constantly 1 to 9×10⁻³ Pa. The shape of the resultant organic film solar battery was 2 mm×2 mm regular tetragon. The resultant organic film solar battery was irradiated with a constant light using Solar Simulator (manufactured by Bunkoukeiki Co., Ltd., trade name: OTENTO-SUNII: AM 1.5G filter, irradiance: 100 mW/cm²), and the generating current and voltage were measured and the photoelectric conversion efficiency was determined. The photoelectric conversion efficiency was 5.22%, the short circuit current density was 9.36 mA/cm², the open circuit voltage was 0.91 V, and FF (fill factor) was 0.61.

Comparative Example 2

Fabrication and Evaluation of Organic Film Solar Battery

A glass substrate carrying an ITO film functioning as an anode of a solar battery formed thereon was prepared. The ITO film had been formed by a sputtering method, and its thickness was 150 nm. This glass substrate was subjected to an ozone UV treatment, performing a surface treatment of the ITO film. Next, a PEDOT:PSS solution (manufactured by Heraeus Materials Technology, CleviosP VP AI4083) was coated on the ITO film by spin coating, and heated in atmospheric air at 120° C. for 10 minutes, to form a hole injection layer having a thickness of 30 nm. On this hole injection layer, the above-described composition 2 was coated by spin coating, to form an active layer (thickness: about 100 nm).

Next, 1 part by weight of a 45 wt % isopropanol dispersion of zinc oxide nano particles (particle size: 20 nm to 30 nm) (HTD-711Z, manufactured by TAYCA Corporation) and 10 parts by weight of isopropanol were mixed, to prepare a coating solution. This coating solution was coated with a thickness of 50 nm on the active layer by spin coating, and dried to form an oxide layer. Thereafter, the layer was baked under a nitrogen atmosphere under condition of 150° C./10 minutes. Thereafter, silver was vapor-deposited with a thickness of 100 nm by a vacuum vapor deposition machine, to fabricate an organic film solar battery. The degree of vacuum in vapor deposition was constantly 1 to 9×10⁻³ Pa. Thereafter, the organic film solar battery device was sealed with a glass plate using a UV curing sealant. The shape of the resultant organic film solar battery was 2 mm×2 mm regular tetragon. The resultant organic film solar battery was irradiated with a constant light using Solar Simulator (manufactured by Bunkoukeiki Co., Ltd., trade name: OTENTO-SUNII: AM 1.5G filter, irradiance: 100 mW/cm²), and the generating current and voltage were measured and the photoelectric conversion efficiency was determined. The photoelectric conversion efficiency was 4.85%, the short circuit current density was 11.95 mA/cm², the open circuit voltage was 0.72 V, and FF (fill factor) was 0.57.

Thereafter, the device was preserved with heating for 50 hours in a constant temperature chamber at 85° C. in atmospheric air. Thereafter, the device was returned to room temperature, and the photoelectric conversion efficiency was determined. The photoelectric conversion efficiency was 4.80%, the short circuit current density was 11.90 mA/cm², the open circuit voltage was 0.72 V, and FF (fill factor) was 0.56.

The invention claimed is:

1. A method for producing an organic photoelectric conversion device, comprising forming an anode, forming an active layer on the anode, forming an oxide layer comprising a zinc oxide doped with at least one metal selected from the group consisting of gallium, aluminum, indium and boron on the active layer, and forming a cathode on the oxide layer by a vacuum film formation method.

2. The method for producing an organic photoelectric conversion device according to claim 1, wherein the metal to be doped is gallium.

3. The method for producing an organic photoelectric conversion device according to claim 1, wherein a coating solution comprising the zinc oxide doped with the metal is coated for film formation on the active layer to form the oxide layer.

4. The method for producing an organic photoelectric conversion device according to claim 1, wherein the zinc oxide doped with the metal is in the form of particles.

5. The method for producing an organic photoelectric conversion device according to claim 1, wherein formation of the active layer is conducted by a coating method.

6. The method for producing an organic photoelectric conversion device according to claim 1, wherein the active layer comprises a fullerene and/or a fullerene derivative and a conjugated polymer compound.

* * * * *